United States Patent [19]

Streifer et al.

[11] Patent Number: 4,624,000
[45] Date of Patent: Nov. 18, 1986

[54] PHASED ARRAY SEMICONDUCTOR LASERS WITH PREFERRED EMISSION IN A SINGLE LOBE

[75] Inventors: William Streifer, Palo Alto; Donald R. Scifres, Los Altos; Robert D. Burnham, Palo Alto; Thomas L. Paoli, Los Altos, all of Calif.

[73] Assignee: Xerox Corporation, Stamford, Conn.

[21] Appl. No.: 667,251

[22] Filed: Nov. 1, 1984

[51] Int. Cl.$^4$ ............................................. H01S 3/19
[52] U.S. Cl. ...................................... 372/45; 372/46; 372/50; 372/48
[58] Field of Search ....................... 372/50, 45, 46, 48

[56] References Cited

U.S. PATENT DOCUMENTS

| Re. 31,806 | 1/1985 | Scifres et al. | 372/50 |
|---|---|---|---|
| 4,255,717 | 3/1981 | Scifres et al. | 372/50 |
| 4,369,513 | 1/1983 | Umeda et al. | 372/50 |
| 4,385,389 | 5/1983 | Botez | 372/50 |
| 4,475,200 | 10/1984 | Lee | 372/50 |
| 4,509,173 | 4/1985 | Umeda et al. | 372/50 |
| 4,534,033 | 8/1985 | Nishizawa et al. | 372/50 |

OTHER PUBLICATIONS

William Streifer et al., "Channeled Substrated Nonplanar Laser Analysis Part 1 . . . ", IEEE J. of Quantum Electronics, vol. QE-17(5), pp. 736-744, May, 1981.
J. Katz et al., "Supermode Discrimination-In Phase-Locked Arrays of Semiconductor Lasers", IEEE International Semiconductor Laser Conference in Brazil, Jul. 1984.
D. E. Ackley, "Phase-Locked Injection Laser Arrays with Non-Uniform Stripe Spacing", IEEE International Semiconductor Laser Conference in Brazil, Jul. 1984.
William Streifer et al., "Phased Array Diode Lasers", Laser Focus/Electro-Optics Magazine, Jun. 1984.
J. K. Butler et al., "Coupled-Mode Analysis of Phase-Locked Injection Laser Arrays", Appl. Phys. Lett., 44(3), 2/1/84, pp. 293-295.
E. Kapon et al., "Coupling Mechanism of Gain-Guided Integrated Semiconductor Laser Arrays", Appl. Phys. Lett., 44(4), pp. 289-391, 1/15/84.
E. Kapon, "Chipped Arrays of Diodes for Supermode Control", Appl. Phys. Lett., vol. 45(3), pp. 200-202, 8/1/84.
Y. Twu et al., "High Power Coupled Ridge Waveguide Semiconductor Laser Arrays", Appl. Phys. Lett., vol. 45(7), pp. 709-711, 10/1/84.
S. Mukai et al., "Fundamental Mode Oscillation of a Buried Ridge Waveguide Laser Array", Appl. Phys. Lett., vol. 45(8), pp. 834-835, 10/15/84.

Primary Examiner—James W. Davie
Attorney, Agent, or Firm—W. Douglas Carothers, Jr.

[57] ABSTRACT

A phased array semiconductor laser comprises a plurality of spatially disposed multiple lasing elements formed relative to an active region providing optical cavities and multi-emitters for light wave generation and propagation under lasing conditions. The optical field of the lasing elements are coupled into the optical cavities of adjacent lasing elements to provide a phased locked condition across the array. Structural means associated with the laser causes regions between the optical cavities to produce higher gain in those between regions as compared to the gain experienced in the optical cavities by spatially modulating the optical overlap of the optical field of each of the lasing elements laterally across the array so as to favor the fundamental supermode over the other potential supermodes of the array laser. The associated structural means may comprise a transparent waveguide layer adjacent to the active region and having a periodic undulation laterally across the laser array to provide the spatial modulation, or may comprise current confinement means to spatially modulating the current distribution laterally across the laser array to provide the spatial modulation or may comprise a combination of both types of such spatial modulation.

26 Claims, 25 Drawing Figures

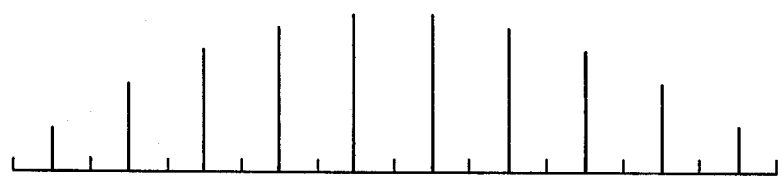
FIG. IA
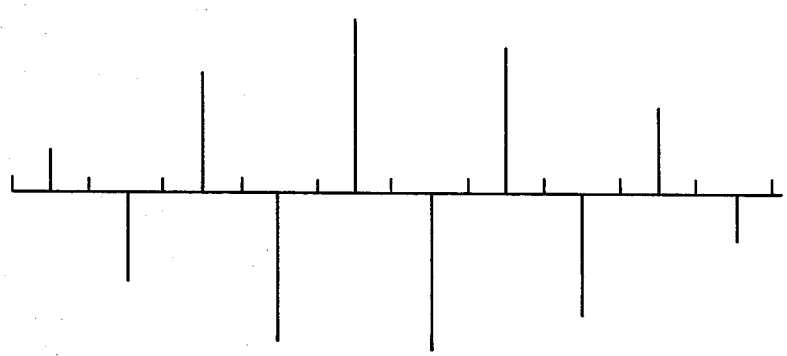
FIG. IB
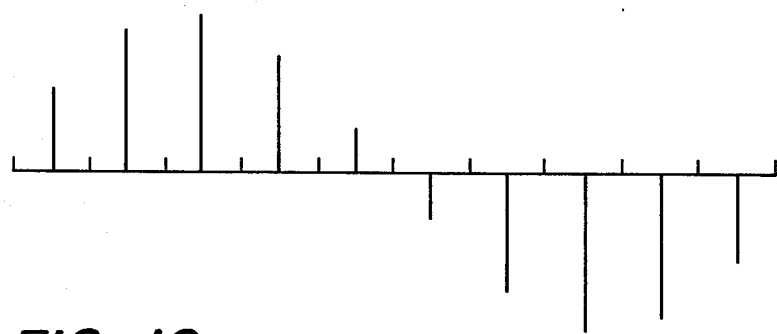
FIG. IC

U.S. Patent  Nov. 18, 1986  Sheet 5 of 12  4,624,000
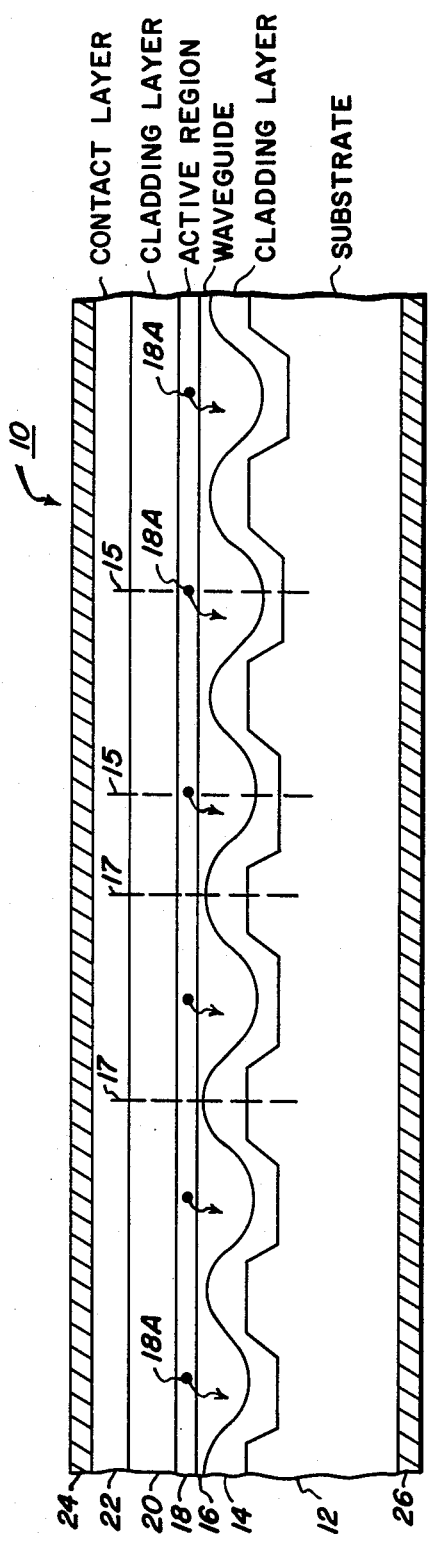
FIG. 4A
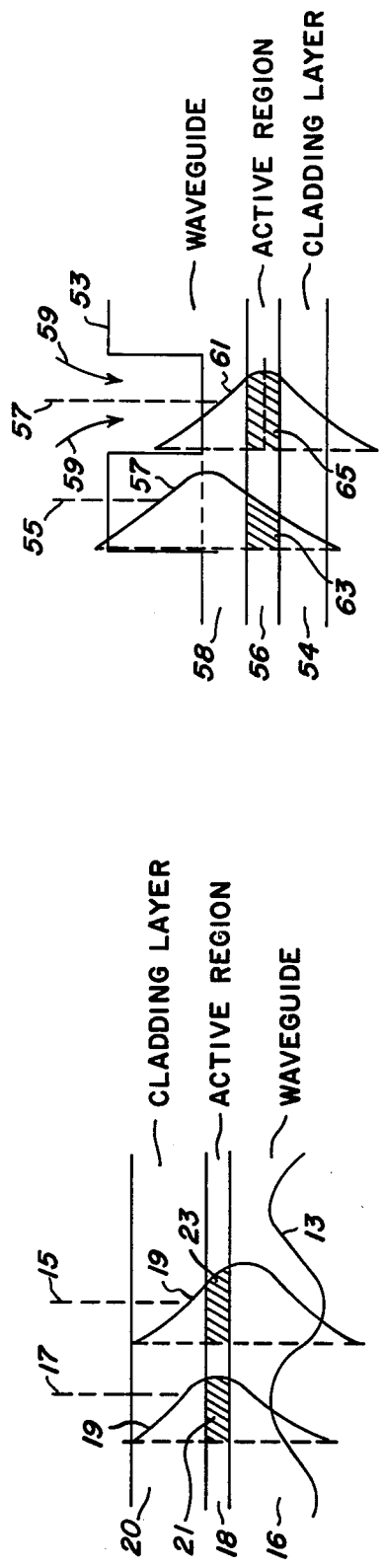
FIG. 6A
FIG. 4B

PHASED ARRAY SEMICONDUCTOR LASERS WITH PREFERRED EMISSION IN A SINGLE LOBE

BACKGROUND OF THE INVENTION

This invention relates to phased array semiconductive lasers having multi-emission or broad emission capabilities and in particular to phased array lasers having structural design that maintains their operation in a preferred single lobe far field pattern.

Phased array semiconductor lasers comprise a plurality of closely coupled or spaced emitters on the same internal structure of substrate. Examples of such phased array lasers are illustrated in U.S. Pat. No. 4,255,717, now U.S. Pat. No. Re. 31,806, issued Jan. 15, 1985, and in an article of William Streifer et al., entitled "Phased Array Diode Lasers", published in the June 1984 Issue of Laser Focus/Electro-Optics. The emitters of such a laser are confined by the periodically spaced current confinement means, e.g. stripes, for current pumping and establishment of spaced optical filaments in the active region of the structure or by internal waveguide structuring. The current confinement means may be interconnected or the emitters closely spaced to a degree that the optical mode established in each of the filaments couples to neighboring optical filament modes, i.e., the evanescent wave overlaps into adjacent optical lasing cavities. The array of optical fields produced become phased locked, and, if the phase difference between adjacent current confinement means is zero, the lateral radiation pattern in the far field will comprise a single lobe. However, as explained in the abovementioned article, the phased array laser does not operate to radiate in a single lobe but rather generally operate with radiation into two or more lobes in the far field pattern. The phase relationship between adjacent optical filaments is not under control and the phases themselves adjust in a manner to minimize laser threshold current. In most cases, it appears that lasing is favored in a supermode wherein the optical field between adjacent optical emitters passes through zero. This is because in most real refractive index lasers as well as many gain guided lasers, pumping gain is reduced at locations between the laser filaments or emitters.

The foregoing explanation is exemplified by reference to FIG. 1. FIG. 1 is a schematic illustration of an array of N coupled emitters wherein, in the particular case shown, N=10. An array laser with N coupled emitters has N possible coupled modes which are referred to as "supermodes". A supermode is a cooperative lasing of the N optical emitters or filaments of the array laser. Since there are N emitters, there are N possible supermodes since all these emitters are optically coupled together.

Each supermode has the property that the $1^{st}$ and $N^{th}$ supermode have the same intensity pattern or envelope, the $2^{nd}$ and the $N-1^{th}$ have the same intensity envelope, and, in general, the $i^{th}$ and $N-i^{th}$ have the same intensity envelopes.

FIG. 1A shows the supermode field amplitude pattern for a ten emitter or element array laser wherein i=1, i.e., the $1^{st}$ or fundamental supermode. The $1^{st}$ or fundamental supermode has all emitters lasing in phase with an amplitude distribution representative of half a sinusoidal cycle. This is the only supermode pattern that radiates in a single central lobe in the far field pattern because all emitters radiate in phase.

FIG. 1B shows the supermode field amplitude pattern for the $N^{th}$ supermode which, for this particular example, is i=10. The amplitude pattern is very similar to the amplitude pattern shown for the $1^{st}$ supermode in FIG. 1A except that alternating emitters have alternating phase, i.e., are out of phase by $\pi$. As a result, this supermode will radiate in two fairly symmetrical lobes in the far field pattern.

There are eight other supermodes for i=10. The supermode field amplitude pattern for the $2^{nd}$ supermode is shown in FIG. 1C wherein the amplitude envelope across the array is sinusoidal comprising one positive half cycle and one negative half cycle. The $2^{nd}$ supermode will lase in two closely spaced symmetrical lobes in the far field pattern.

Thus, for a uniformly spaced array of identical emitters, the $1^{st}$ and $N^{th}$ supermode envelopes are half a sinusoidal period, the second and the $N-1^{th}$ supermode envelopes are two half sinusoidal periods, etc. The phases of the individual emitters in the $1^{st}$ and $N^{th}$ supermodes differ. Specifically, for the $1^{st}$ supermode, all emitters are in phase and for the $N^{th}$ supermode, the phases alternate between zero and $\pi$. Usually the $1^{st}$ and $N^{th}$ supermodes have the lowest current thresholds as compared to all other supermodes because their intensity envelopes do not exhibit nulls near the center of the array where the charge density is greater as a result of current spreading and charge diffusion in the active region of the array laser. However, as previously indicated, the $N^{th}$ supermode, which radiates in two lobes, has a lower current threshold of operation than the $1^{st}$ supermode due to the lower gain which naturally occurs between emitting regions.

Phased array lasers have high utility due to their high power output. It is preferred that the power be concentrated in a single lobe, i.e., in the $1^{st}$ supermode. The reason is that a substantial majority of all laser applications require power in a single far field lobe. If radiation is experienced in more than one lobe, measures are taken to diminish or otherwise attempt to eliminate or block off the other operating lobes.

In the article of William Streifer et al, "Channeled Substrated Nonplanar Laser Analysis Part 1: Formulation and the Plano-Convex Waveguide Laser", IEEE Journal of Quantum Electronics, Vol. QE-17(5), pp. 736-744, May, 1981, a single stripe laser with a planar active region adjacent to a waveguide laser of spatially lateral varying thickness is analyzed. Looking at FIG. 2 of this article, the equivalent real refractive index is greatest in the central region of the active layer where the adjacent waveguide layer is at its thickest portion width, i.e., at the center of the waveguide layer, and therefore provides real refractive index waveguiding in the same region of both the active and waveguide layer.

However, the filling factor, $\Gamma$, which is the percentage of optical modal intensity in the laser active region, is at a minimum at this point, i.e., at the point of maximum index. Since local gain, $\gamma(y)$, is proportional to the filling factor, $\Gamma$, local gain will also be lower at this point. This is illustrated in FIG. 3 of the cited article wherein the two curves show the equivalent refractive index, $n_{eq}$, and the filling factor, $\Gamma$, versus latent position along the active region of the laser shown in FIG. 2 of the article. To be noted is that the two curves are practically opposite complements of one another. Thus, those regions of highest gain in the active region would be those areas offset or adjacent to the center of the active region.

In the case of a multi-emitter laser, the intensity I(y) for the $1^{st}$ and $N^{th}$ supermodes will respectively take on the intensity envelopes illustrated in FIGS. 2A and 2B and the corresponding gain profile $\gamma(y)$ will have the envelope shown in FIG. 2C. The intensity envelope for $1^{st}$ supermode in FIG. 2A illustrates the higher overall intensity experienced as compared to the intensity pattern for $N^{th}$ supermode. To be noted is that the local gain peaks of each of the emitters coincides with the $i^{th}$ and $N^{th}$ mode peaks.

In the case where the emitters of the phased array laser are real refractive index waveguide lasers, the overall gain of the $1^{st}$ and $N^{th}$ supermodes are given by the equations:

$$g_1 = \int_{-\infty}^{\infty} I_1(y)\gamma(y)dy / \int_{-\infty}^{\infty} I_1(y)dy \qquad (1a)$$

and $$g_N = \int_{-\infty}^{\infty} I_N(y)\gamma(y)dy / \int_{-\infty}^{\infty} I_N(y)dy \qquad (1b)$$

Since $I_N$ is relatively more concentrated in the regions of the waveguides where local gain is a maximum, the overall gain of $I_N$ mode exceeds that of the $I_1$ mode and the $I_N$ mode, as a result, lases at a lower pumping current. As a result, the $N^{th}$ supermode will be preferred since it has a lower threshold of operation than the $1^{st}$ supermode. Unfortunately, the $N^{th}$ supermode in most cases radiates in two lobes, as previously mentioned.

Recently, there has been much activity relative to phase locked array lasers or phased array lasers where efforts have been established to discriminate among the supermodes and provide fundamental supermode selection (N=1). One such suggestion was at the IEEE $9^{th}$ International Semiconductor Laser Conference in Brazil, July, 1984 wherein J. Katz et al. presented a talk on supermode discrimination by controlling lateral gain distribution along the plane of the lasing elements by incorporating a separate contact to each laser array element and tailoring the currents through the array laser elements. The abstract for the talk is found in the Proceedings of the Conference at pages 94 and 95 entitled "Supermode Discrimination in Phase-Locked Arrays of Semiconductor Laser Arrays".

What is needed is to somehow design a phased array semiconductor laser so that the gain, $g_1$, of the preferred $1^{st}$ supermode will exceed the gain, $g_N$, that of the multilobe $N^{th}$ supermode of such phased array lasers. This is graphically illustrated in FIG. 3 wherein in a phased array semiconductor laser of this invention, the desired intensity envelope of the $1^{st}$ supermode is shown in FIG. 3A, the intensity envelope of the $N^{th}$ supermode is shown in FIG. 3B and the corresponding gain profile, $\gamma(y)$, is shown in FIG. 3C. To be noted is that the gain peaks have each been shifted one half period relative to the corresponding intensity peaks of the laser's points of high emission intensity in connection with all supermodes so that the gain peaks of such points coincide with the trough or valley points of the supermode intensity pattern.

It is, therefore, the object of this invention to provide phased array semiconductor laser structures that are designed to shift the gain relative to the optical guide of the laser emitters so that such laser structures will continuously operate in the preferred $1^{st}$ supermode.

SUMMARY OF THE INVENTION

According to this invention, phased array semiconductor lasers provide supermode operation with preferred radiation in a single lobe. This is accomplished by providing means in the phased array laser structure to shift the region of higher gain relative to the region of preferred optical waveguidance, i.e., the region of higher equivalent refractive index representative of the optical lasing cavity of each of the multi-emitters of the array laser.

The phased array semiconductor laser comprises a plurality of spatially disposed multiple lasing elements formed relative to an active region to provide optical cavities for light wave generation and propagation under lasing conditions. The optical field of the lasing elements are coupled into the optical cavities of adjacent lasing elements to provide a phased locked condition across the array. Structural means associated with the array laser causes regions between the optical cavites to produce higher gain in the between regions compared to the gain experienced in the optical cavities by spatially modulating the optical overlap of the optical field of each of the lasing elements laterally across the array and, as a result, favor the fundamental supermode over the other potential supermodes of the array laser. Said another way, the filling factor, $\Gamma$, in the between regions is made greater vis a vis the optical cavity regions by the spatial modulation brought about by the structural means.

The array laser may include a transparent waveguide layer adjacent to the active region and having a periodic undulation laterally across the laser array to provide this spatial modulation to enhance the amount of gain experienced in the between regions compared to the gain experienced in the optical cavities. The spatial modulation may also include current confinement means to spatially modulate the current distribution laterally across the laser array to provide additional spatial modulation to enhance the amount of gain experienced in the between regions compared to the gain experienced in the optical cavities.

Further, structural means associated, with said laser to cause regions between said optical cavities to produce higher gain in said between regions compared to the gain experienced in said optical cavities by spatially modulating the current distribution laterally across said laser array so as to favor the fundamental supermode over the other potential supermodes of said laser, said structural means comprising an array of current confinement means, portions of which are outside of said optical cavities at said between regions to enhance the amount of gain experienced in said between regions compared to the gain experienced in said optical cavities. To spatially modulate the optical overlap of the optical field in a phased array semiconductor laser of the gain guided laser type, an array of current confinement means is provided to permit spatially modulated current distribution along the cavity length of the array laser such that the integrated gain of the fundamental supermode is higher than that of any other allowed supermode of the array laser. The current confinement means may comprise current confinement stripes positioned relative to each of the optical guide regions and extending along at least one portion of the length of each of the array laser optical guide regions with offset stripes on adjacent sides of the optical guide regions extending along at least one other portion of the length of the array laser optical guide regions.

The active region may comprise single planar active layer or a single quantum well or multiple quantum well.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 1A illustrates the supermode field amplitude pattern for the fundamental supermode of a ten element array laser.

FIG. 1 illustrates the supermode field amplitude pattern for the $N^{th}$ supermode (N=10) of a ten element array laser.

FIG. 1C illustrates the supermode field amplitude pattern for the second supermode of a ten element array laser.

FIG. 4A schematically illustrates a phased array semiconductor laser, similar to the laser of FIG. 4 but made by a different processing procedure, and having structural means internal of the laser fulfilling the conditions of FIG. 3 to achieve fundamental supermode operation.

FIG. 4B schematically illustrates a detailed section of the laser of FIG. 4 for use in explanation of optical overlap and the importance of the filling factor, $\Gamma$, and lateral gain distribution.

FIG. 6A schematically illustrates a detailed section of the laser of FIG. 6 for use in explanation of optical overlap and the importance of the filling factor, $\Gamma$, and lateral gain distribution.

DETAILED DESCRIPTION OF THE PREFERRED EMBODIMENTS

Figure 4:
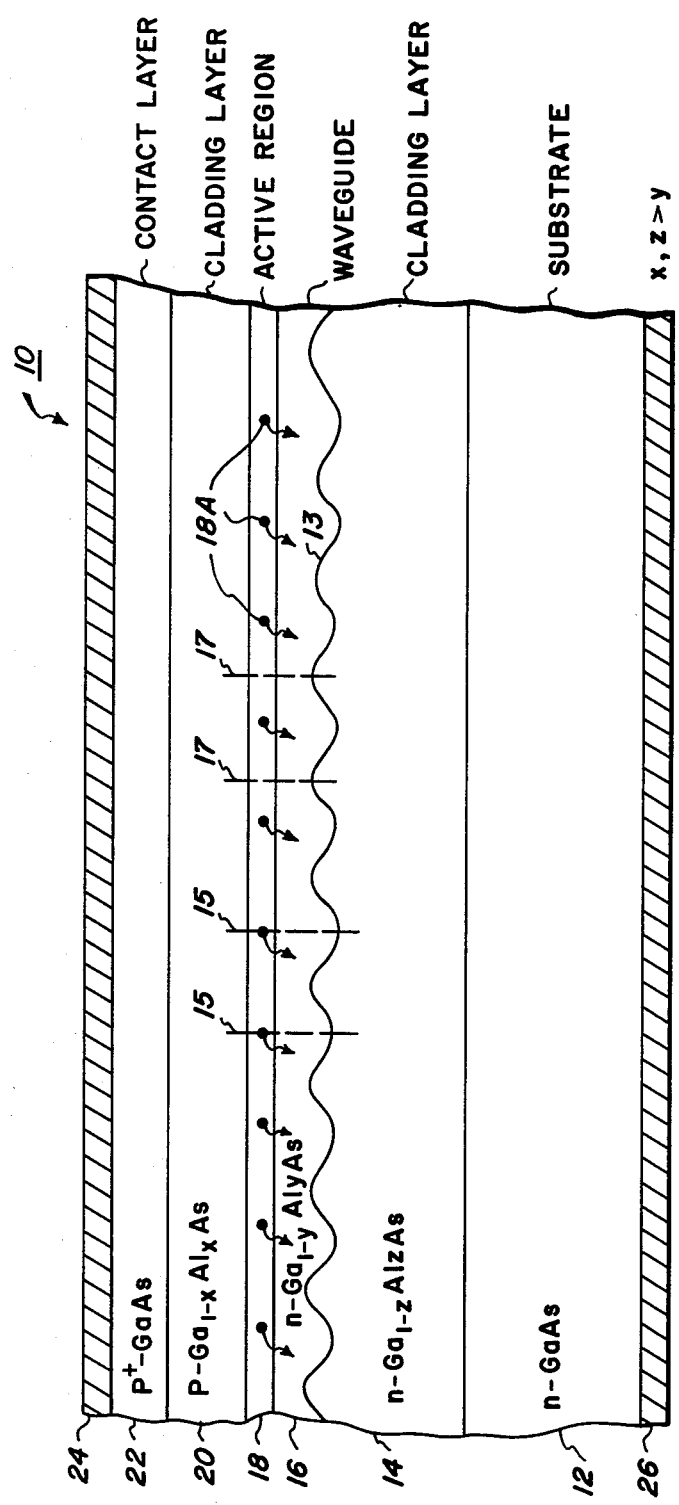
FIG. 4 schematically illustrates a phased array semiconductor laser comprising this invention with structural means internal of the laser fulfilling the conditions of FIG. 3 to achieve fundamental supermode operation and thereby provide preferred emission in a single lobe in the far field pattern of the laser.

Reference is now made to FIG. 4 wherein there is illustrated a first embodiment of the phased array semiconductor laser of this invention. Phase locked array laser 10 is illustrated in the III-V material regime of GaAs/GaAlAs, as is the case also for subsequent embodiments to be described. The configuration of semiconductor layers is conventional in the case of single emitter lasers. The structure differs here in the employment of a transparent waveguide layer and a broad area continuous p-side contact for a multi emitter phased locked array laser.

Laser 10 comprises n-GaAs substrate 12 upon which are consecutively deposited in a cladding layer 14 of n-Ga$_{1-z}$Al$_2$As, a transparent waveguide layer 16 of n-Ga$_{1-y}$Al$_y$As, active region 18, cladding layer 20 of p-Ga$_{1-x}$Al$_x$As and contact layer of p+-GaAs. Deposit on contact layer 22 is a continuous broad area metal contact 24. On the bottom surface of substrate 12 is deposited a continuous broad area metal contact 26. Active region 38 may comprise a single active layer or, alternatively, may comprise an active region of either single quantum well or multiquantum well as is known in the art.

This phased array laser 10 in FIG. 4 may be grown by conventional epitaxy. The structure shown in FIG. 4 is most easily grown in a liquid phase epitaxy and can also be accomplished utilizing masking techniques in molecular beam (MBE) epitaxy or metal-organic chemical vapor deposition (MO-CVD). The procedure for growth requires that layer 14 be initially grown and then the structure be removed from the growth environment for selectivelyy etching the surface of layer 14 to provide undulation 13. The structure is then return to the growth environment for the completion of the growth of layers 16, 18, 20 and 22. In FIG. 4A, the same structure may be grown in a liquid phase epitaxy and can also be accomplished utilizing masking techniques in molecular beam (MBE) epitaxy or metal-organic chemical vapor deposition (MO-CVD) but layer growth is carried out on a grooved substrate as illustrated at 23 in FIG. 4A.

In either case, the structure is epitaxially grown to produce a periodic structure or undulation 13 at the interface of cladding layer 14 and transparent waveguide layer 16. Waveguide layer 16 has a greater bandgap than active region 18 so that it is transparent and provides a barrier to injected holes. Undulation 13 provides for a plurality of lateral real refractive index waveguides centered at dotted lines 15 in waveguide layer 16, in a similar manner illustrated for a single real refractive index waveguide described in the article of William Streifer et al, "Channeled Substrated Nonplanar Laser Analysis Part 1: Formulation and the Plano-Convex Waveguide Laser", supra, and laser emitters 18A occur in regions 15 as shown in FIGS. 4 and 4A.

The modal gain is greater at dotted lines labeled 17 compared to those labeled 15. The reason for this behavior, which is one important aspect of this invention, resides in the use of the waveguide layer 16. This waveguide layer provides laterally across the structure favored areas of optical waveguiding alternating with regions of favored gain intensity. With reference to FIG. 4B, optical overlap regions 17 compared to regions 15 provide for light wave 19 to be more concentrated at active region 18 in regions 17 so that the filling factor, $\Gamma$, indicated by the cross-hatched area 21 in FIG. 4B, in regions 17 is higher than compared to the filling factor, $\Gamma$, indicated by the cross-hatched area 23 in FIG. 4B, in regions 15. Since the filling factor is proportional to gain, the conditions of this invention in FIG. 3 will be fulfilled.

Figure 5:
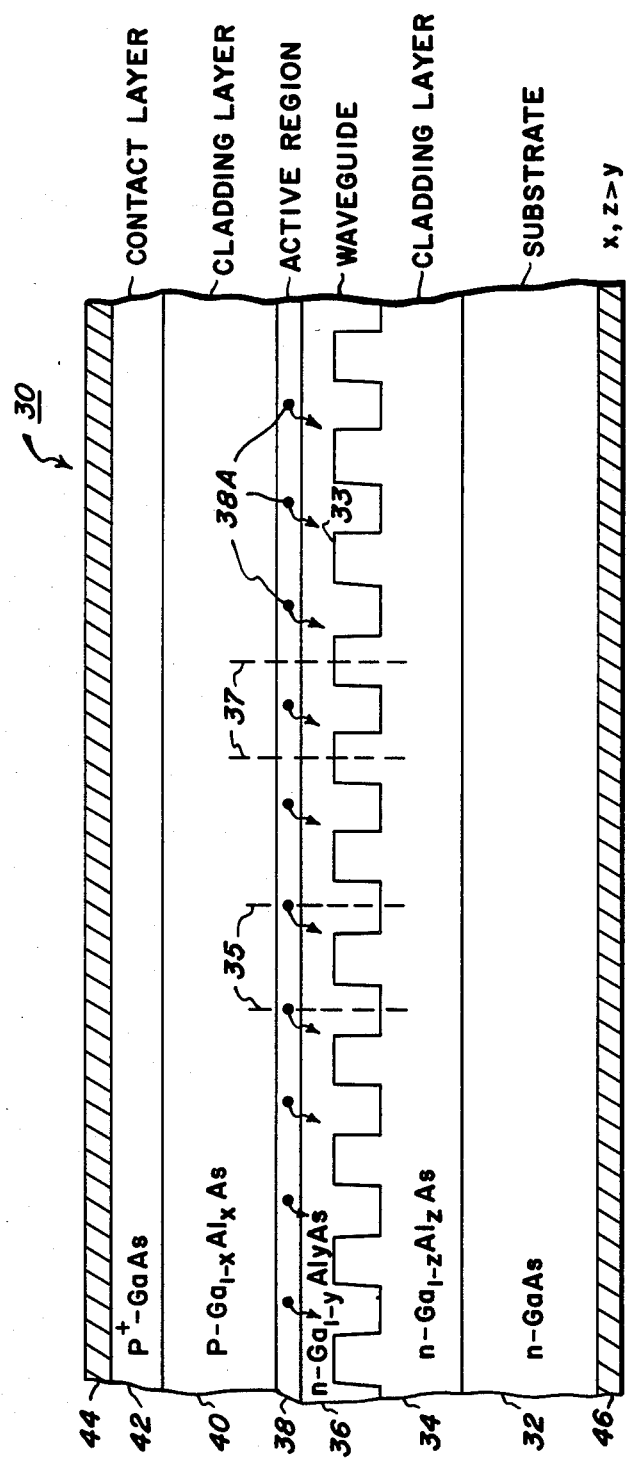
FIG. 5 schematically illustrates a further embodiment of a phased array semiconductor laser of this invention along the theme of the structural means illustrated in the previous figure.

FIG. 5 represents another phased array laser 30, which in a manner similar to laser 10 of FIG. 4, provides the optical overlap mechanism as a means to shift the higher gain regions relative to the optical guide regions. Laser 30 comprises a similar layered structure wherein there is deposited on substrate 32 of n-GaAs the sequential layers comprising cladding layers 34 n-Ga$_{1-z}$Al$_z$As, the transparent wavguide layer 36 of n-Ga$_{1-y}$Al$_y$As, active region 38, cladding layer of p-Ga$_{1-x}$Al$_x$As, and contact layer 42 of p+-GaAs. Again, active region 38 may comprise a single active layer or alternatively may comprise an active region of either single quantum well or multiquantum well structure.

During the growth of the laser 30, a periodic structure or undulation 33 is formed at the interface of layers 34 and 36. This indulation is conventionally formed by standard photolithographic procedures and etching after the growth of cladding layer 34 followed by continued epitaxial growth either with liquid phase epitaxy (LPE), metalorganic chemical vapor deposition (MOCVD) or molecular beam epitaxy (MBE). Periodic undulation 33 forms a series of optical guide regions 35 alternating with regions 37 between regions 35 which include emitters 38A. The between regions 37 represent areas of higher gain due to their proximity to active region 38 thereby "forcing" the optical wave overlap in these regions, i.e., the overlap from the propagating light wave in optical guide regions 35, to have more of the wave pattern in active region 38 vis a vis the wave pattern in active region 38 at the regions labeled 35 in the manner as previously indicated relative to the explanation of FIG. 4B.

Regions 35 in waveguide layer 36 represent passive waveguides due to the relatively higher real refractive index in these regions, vis a vis regions 37. Again, in view of the fact that the between regions 37 provide spatially modulated optical overlap of the optical field for each of the lasing elements confined relative to regions 35, the integrated gain in regions 37 will be higher gain compared to regions 35. With the higher gain offset in regions 37 between regions 35 representing the emitters 38A, the conditions for intensity and gain illustrated in FIG. 3 will be fulfilled and phased array laser 30 will operate in the 1$^{st}$ or fundamental supermode.

Figures 2A, 2B, 2C:
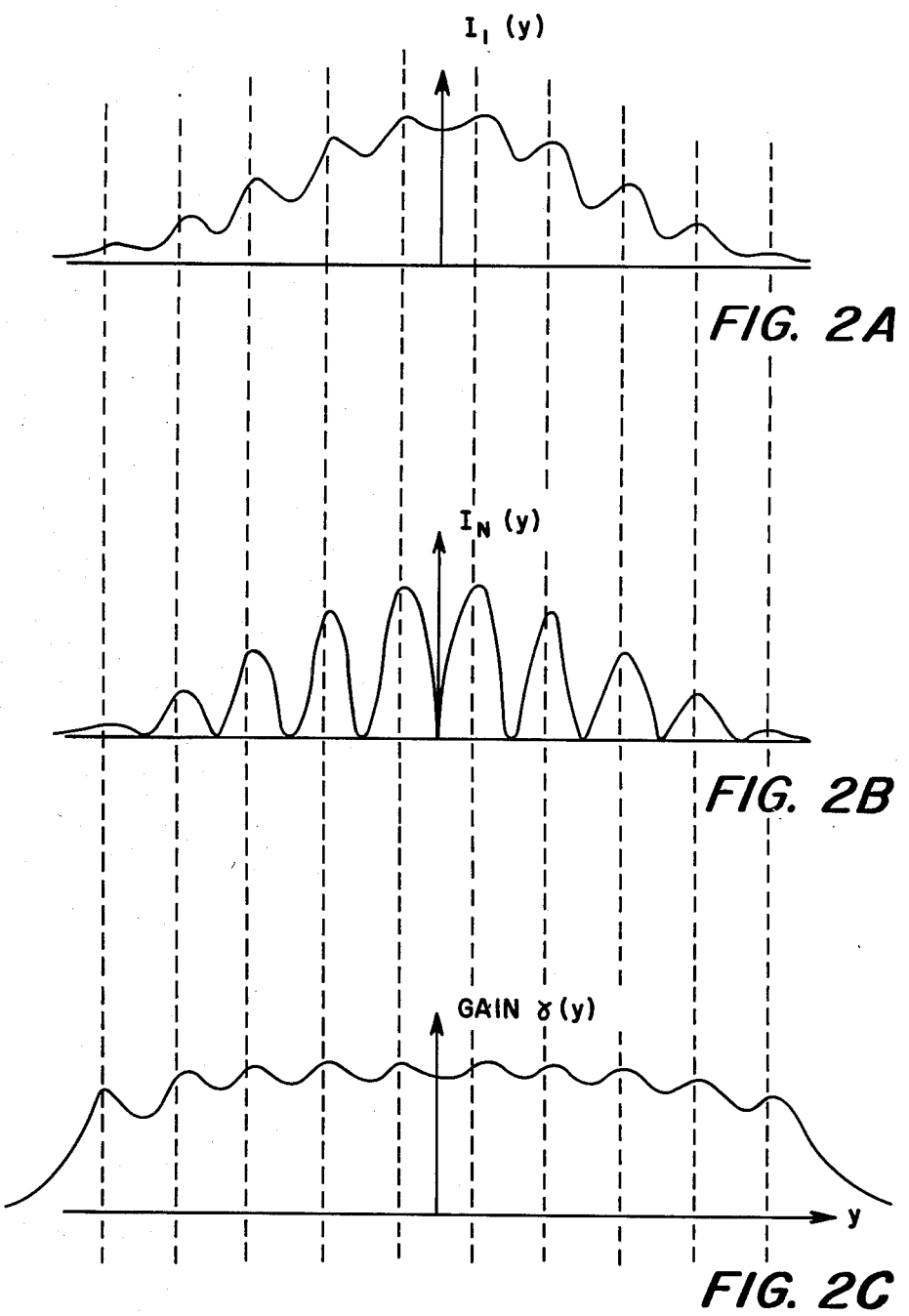
FIG. 2A illustrates the supermode intensity envelope for the fundamental supermode of a ten element array laser.
FIG. 2B illustrates the supermode intensity envelope for the $N^{th}$ supermode (N=10) of a ten element array laser.
FIG. 2C illustrates the modal gain $\gamma(y)$ profile for the ten element array laser of FIGS. 2A and 2B showing that the gain intensity peaks coincide with the intensity peaks of the supermodes.
Figures 3A, 3B, 3C:
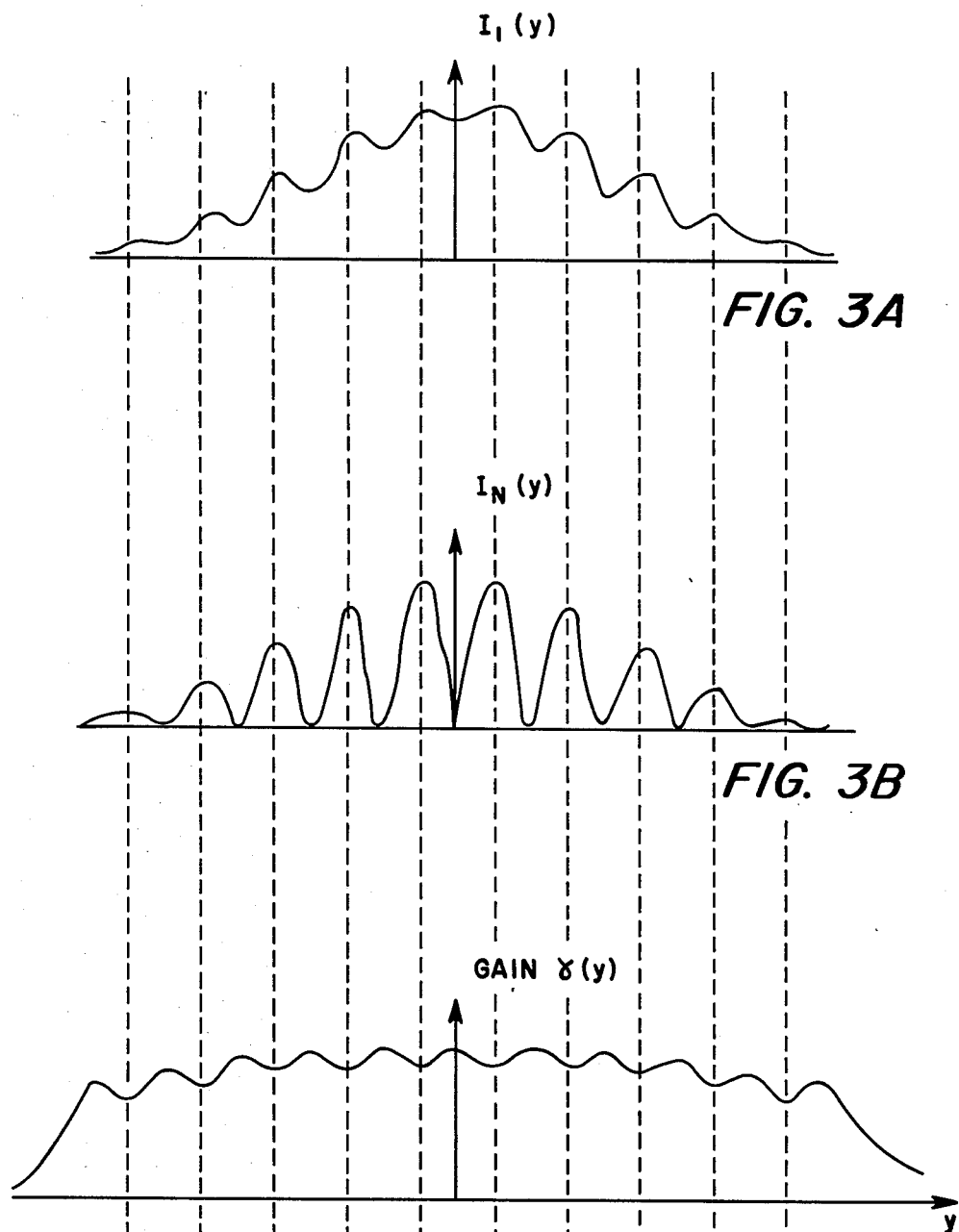
FIGS. 3A-3C illustrate respectively the same envelopes and profile as FIGS. 2A-2C except that the gain intensity peaks are offset one-half period relative to the intensity peaks of the supermodes which is ideal for fundamental supermode operation.
Figure 6:
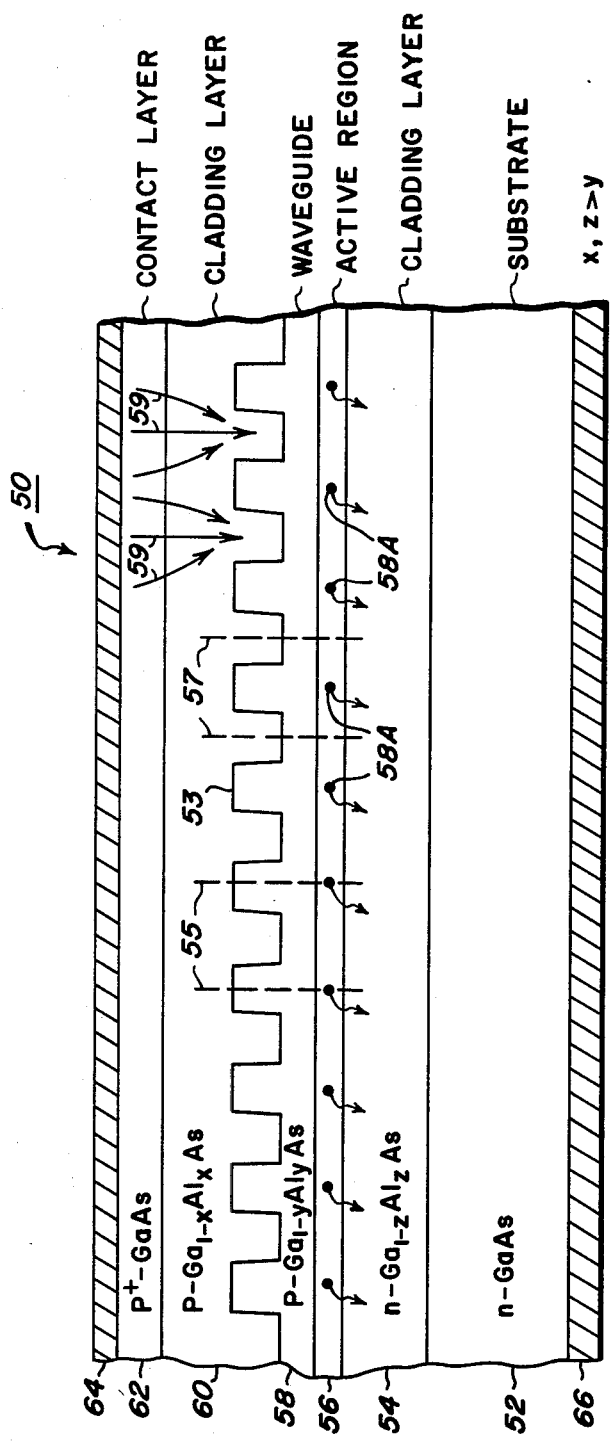
FIG. 6 schematically illustrates still further embodiment of a phased array semiconductor laser of this invention along the theme of the structure means illustrated in the previous figures.

Phased array laser 50 in FIG. 6 is similar in structure to laser 30 of FIG. 5 except laser 50 further utilizes a current modulation scheme in combination with the optical modulation scheme described in the two previous embodiments to provide combined lateral optical overlap distribution and current density distribution to laterally modulate gain in fulfillment of the conditions of FIG. 3.

Laser 50 comprises substrate 52 of n-GaAs upon which are sequentially deposited cladding layer 54 of n-Ga$_{1-z}$Al$_z$As, active region 56, transparent waveguide layer 58 of p-Ga$_{1-y}$Al$_y$As, cladding layer 60 of p-Ga$_{1-x}$Al$_x$As and contact layer 62 of p$^{30}$-GaAs. As in the case of previous embodiments, contact 64 is a broad area metal contact over the surface of contact layer 62. Also, metal contact 66 is deposited on the bottom surface of substrate 52.

Periodic structure or undulation 53 is provided at the interface of layers 58 and 60 in the same manner as mentioned in the previous embodiment, i.e. by photolithography, etching and regrowth. However, the p-type doping of cladding layer 16 may be changed to provide lower resistance to the flow of current as compared to the p-type doping of waveguide layer 58. This doping change would be in the form, for example, of increasing the doping concentration in layer 60, i.e., by increasing zinc doping concentration in p-Ga$_{1-x}$Al$_x$As compared to Ga$_{1-y}$Al$_y$As. As a result, current pumping of laser 50 will provide current flow of least resistance through paths in layer 60 to its lowest reaches identified in the regions 57 between optical guide regions 55 and emitters 58A. This current flow is illustrated in part by arrows 59 in FIG. 6. While there is current flow through optical guide regions 55, the majority of current flow will be through between regions 57. This affirmative funneling of current flow, represented by arrows 59, will provide for regions of higher gain at between regions 57 vis a vis optical guide regions 55 of preferred optical waveguidance, i.e., regions 55 of higher equivalent refractive index, representative of optical lasing cavities and emitters 58A of the laser structure. Thus, current distribution and optical wave overlap treatment both contribute to offsetting regions of higher gain and regions preferred waveguiding.

The phenomenon of offset gain and optical waveguide intensity is illustrated in FIG. 6A. FIG. 6A shows a portion of undulation 53 including layers 54, 56 and 58. In optical guide region 55, the fundamental intensity profile 57 of the propagating light wave will be offset relative to active region 56. The filling factor, $\Gamma$, which is the percentage of the optical modal intensity of this wave present in active region 56, is indicated by the cross hatch area 63. However, the filling factor, $\Gamma$, for the overlap optical wave represented by fundamental intensity profile 61 is greater in between regions 57, as indicated by the cross hatched area 65. Thus, in the case shown in FIG. 6A, the filling factor in area 65 is larger than the filling factor in area 63. This is because the narrowness of the optical guide layer 58 in this region 57 has "forced" the wavefront 61 to be more substantially centered on active region 56. Since local gain is proportional to the filling factor, $\Gamma$, local gain will be higher at the point of highest filling factor. On the other hand, mathamatical calculations confirm that the equivalent index at region 55 is greater than the equivalent index at region 57 so that the optical wave is guided at region 55, ie., the region of greatest equivalent refractive index.

Figure 7:
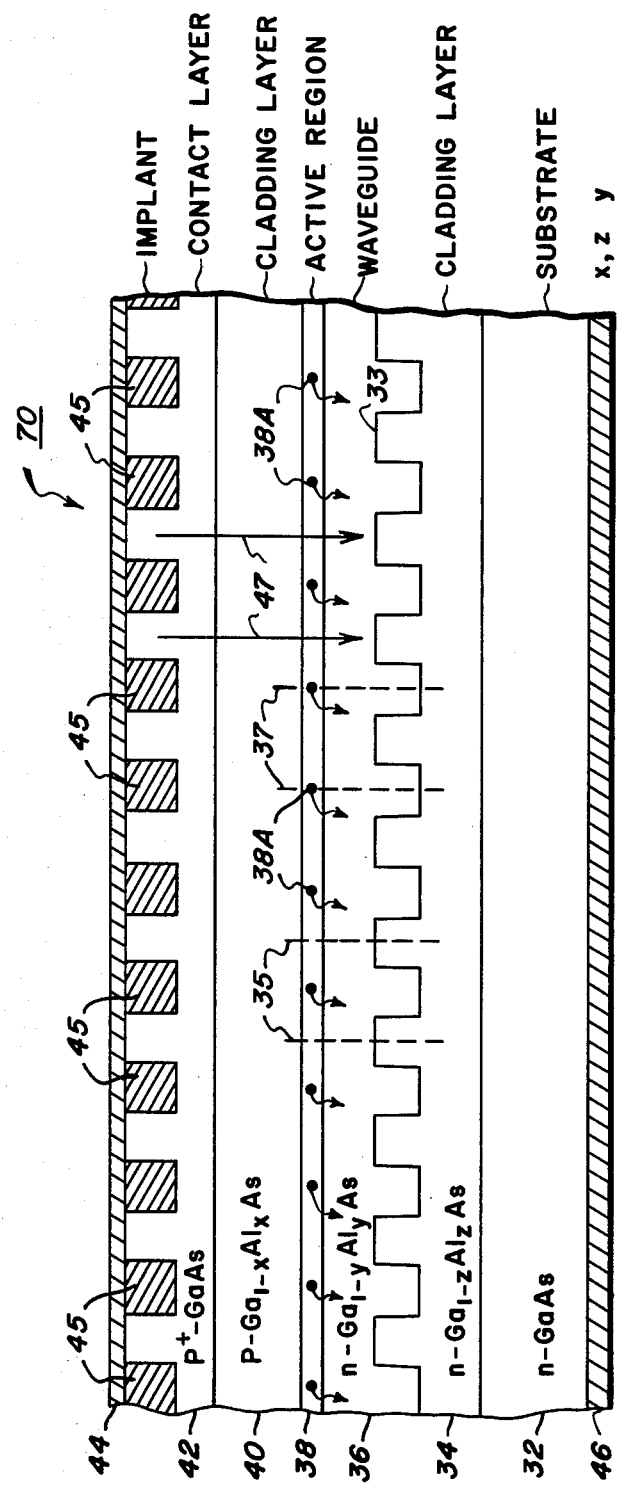
FIG. 7 schematically illustrates a still further embodiment of phased array semiconductor laser of this invention along the theme of the structural means illustrated in previous figures.

Phased array laser 70 shown in FIG. 7 is similar in construction to laser 30 shown in FIG. 5 but also includes means to provide for current distribution for channeling pumping current in the contact layer preferentially to offset regions where higher gain is desired. This means comprises implant regions 45 which may, for example, be insulating N+ implanted regions or alternating insulating regions on the surface of layer 42 or other means of selective current flow. As a result, pumping current provided via contact 44 is channeled between insulating regions 45 in a direction toward the highest reaches of cladding layer 34 in between regions 35, which current channeling is depicted by arrows 47 in FIG. 7. The current directing channels formed via implant regions 45 provide for increase in gain in regions 35 between optical guide regions 37.

Figure 8:
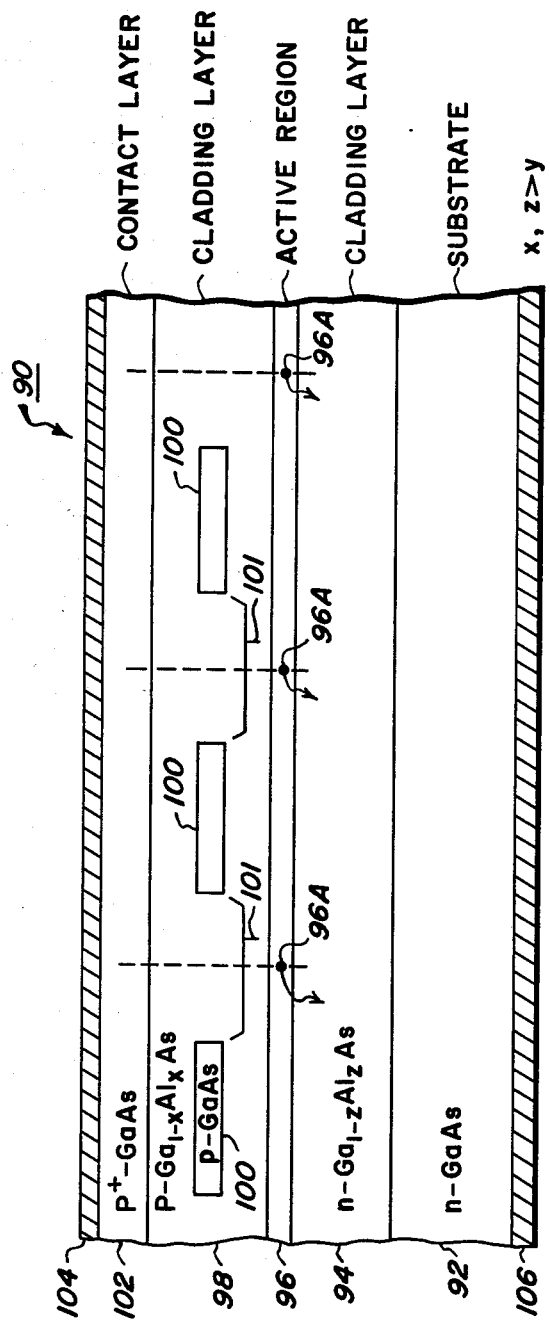
FIG. 8 schematically illustrates a still further embodiment of phased array semiconductor laser of this invention along the theme of the structural means illustrated in previous figures.

FIG. 8 represents still another embodiment of this invention. Phased array laser 90 differs from previous embodiments in that it does not include an independent waveguide layer as illustrated in each of the previous embodiments. Rather, regions of preferred current flow are provided through the employment of higher conducting regions built into or embedded in one or more cladding layers of the phased array laser structure.

Phased array laser 90 comprises substrate 92 of n-GaAs upon which are consecutively deposited cladding layer 94 of n-Ga$_{1-z}$Al$_z$As, active region 96, cladding layer 98 of p-Ga$_{1-x}$Al$_x$As and contact layer 102 of p+-GaAs.

Within the bulk of cladding layer 98, there is provided a periodic array of heavily doped p-type GaAs strips 100 separated by optical guide regions 101. Since GaAs stripe regions 100 are absorbent of lasing light, regions 101 form active optical waveguide regions for light wave propagation under lasing conditions establishing emitters 96A. However, the heavy p-type doping of GaAs stripes regions 100 renders these regions of higher conductivity than the spaces between them so that the current flow into active region 96 is greater in the areas below stripe regions 100 as compared to optical guide regions 101. With carrier injection greater into active region 96 below stripe regions 100, the gain in these regions will be significantly higher as compared to optical guide regions 101. Thus, laser 90 represents another configuration wherein the regions of higher gain are offset relative to regions of optical waveguiding in a multi emitter phase lock array laser.

It should be noted that the use of the stripe region configuration shown in FIG. 8 may be emplyed in either or both cladding layers 94 and 98 utilizing proper doping concentration and type. It should be further noted that the use of the stripe region configuration shown in FIG. 8 for phased aray laser 90 may also be utilized in phased array laser 70 of FIG. 7 in lieu of the implant regions 45 of that structure as another alternative or additional means for preferred current flow to regions 35 of desired higher gain.

Figure 9:
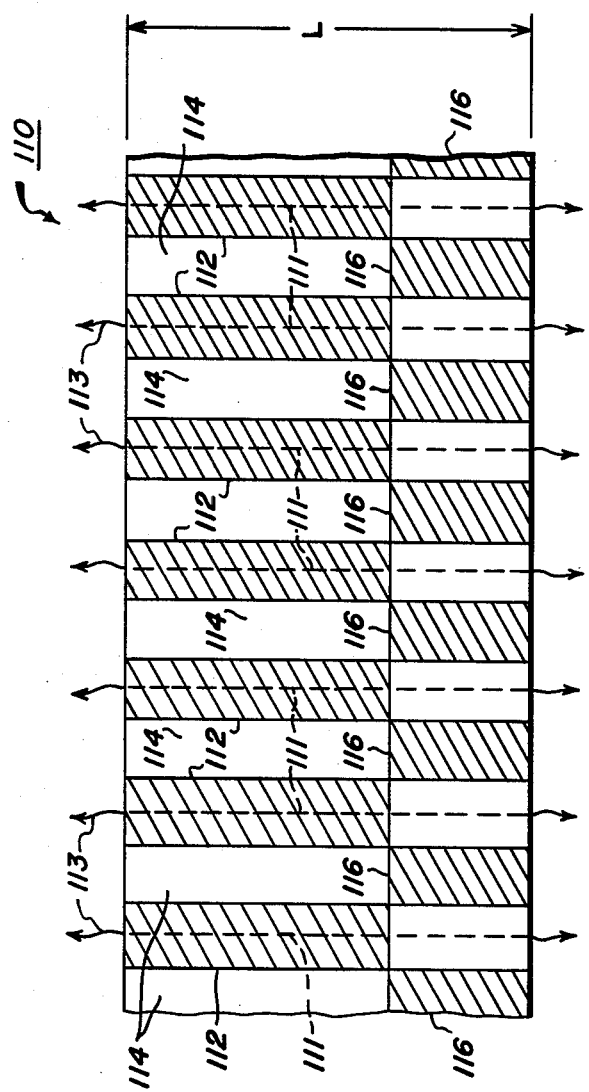
FIG. 9 schematically illustrates a phased array semiconductor laser comprising this invention with structural means external of the laser comprising current confinement means fulfilling the conditions of FIG. 3 to achieve fundamental supermode operation and thereby provide preferred emission in a single lobe in the far field pattern of the laser.

All the previous structures for phased array semiconductor lasers have been of the index guided laser structures. Alternating regions of higher gain relative to alternating regions of preferred waveguiding can also be provided in connection with gain guided laser structures. This may be accomplished by an array of current confinement means to permit spatially modulated current distribution along the cavity length of the multi emitters or laser elements of a phased locked array laser. The current confinement means may comprise of current stripes either in the form of metal contacts or diffused regions positioned relative to each of the optical guide regions and extending along at least a portion of the cavity length of each of the laser elements. Offset stripes are provided on adjacent sides of optical guide regions extending along at least one other portion of the length of each of the multiemitter or laser elements and are positioned in regions where there is no stripe geometry relative to each of the optical guide regions. Examples of current confinement geometry are illustrated in FIGS. 9 and 10. The phased array laser layer geometry is planar and exemplified by the laser geometry shown for laser 90 in FIG. 8 except without the presence of stripe regions 100. FIGS. 9 and 10 illustrate schematically the top view of current confinement geometry utilized in connection with such gain guided laser structures.

In the current confinement geometry 110 of FIG. 9, the optical guide regions and the confined lasing elements of the phased array laser structure are represented by dotted lines 111. At least one portion of the length of each of the laser optical guide regions 111 is provided with a current confinement contact or stripe 112. Other portions of the same region are not provided with any such contact or stripe and are identified as regions 114. In regions on adjacent sides of optical guide regions 111 where there is no contact, i.e., regions 114, there are provided offset contacts or stripes 116.

Contacts 112 and 116 are uniformly pumped. In view of the fact that not all of the optical waveguide region 111 is uniformly pumped, but rather has at least a portion thereof which is not directly pumped but alternatively pumped along adjacent sides of that portion, the integrated gain along the laser cavity length, L, can be made greater in regions between optical guide regions 111 thereby fulfilling the conditions illustrated in FIG. 3, i.e., the offset stripe geometry 114 provides means in the phased array laser structure to shift the region of higher gain relative to the region of preferred waveguidance.

Thus, the specific mechanism for providing alternating regions of higher gain and regions of preferred optical waveguiding is provided along the laser cavity length in gain guided laser structures whereas the specific mechanism for providing alternating regions of higher gain and regions of preferred optical waveguiding is provided laterally across the laser structure in index guided laser structures. However, the specific mechanism, such as offset stripes illustrated in FIG. 9, may also be employed in combination with the specific mechanism illustrated relative to any of the laser structures of FIGS. 4–8 to provide combined enhancement of alternating regions of higher gain and regions of preferred optical waveguiding.

FIG. 10 represents various other current confinement geometries which will perform the increased gain in regions offset relative to the optical waveguide regions of index guided multi emitter laser structures. In each of the illustrations in FIG. 10, the optical waveguide regions are identified by arrows which indicate the emission points from the phased array laser. These illustrations are by no means exhaustive of all possible configurations to provide the offset gain/optical waveguide scheme contemplated by this invention but are representative examples of the scope of such configurations.

Figure 10A:
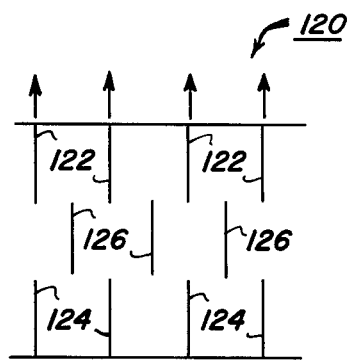
FIGS. 10A-10G schematically illustrate various further current confinement geometry suitable to achieve fundamental supermode operation of phased array lasers.

In FIG. 10A, the current confinement geometry 120 comprises pairs of segment stripes 122 and 124, which represent confined optical guide regions and lasing elements. Stripe segments 122 and 124 are uncoupled at their center region where there is no stripe geometry. In this same region, there are provided offset stripes 126 which fulfill the concept of pumping outside the optical guide regions of the laser elements to provide an increase in gain in these offset regions vis a vis the optical guide regions.

Figure 10B:
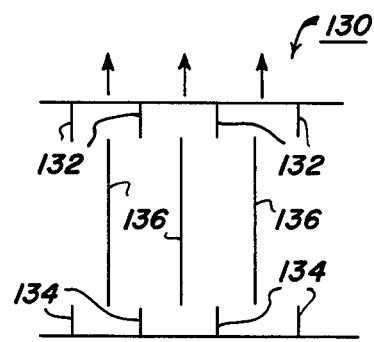

FIG. 10B shows current confinement geometry 130 comprising optical guide region stripes 136 in combination with offset stripe geometry in the form of pairs of aligned segment stripes 132 and 134 at the ends of the cavity length of the laser optical guide regions.

Figure 10C:
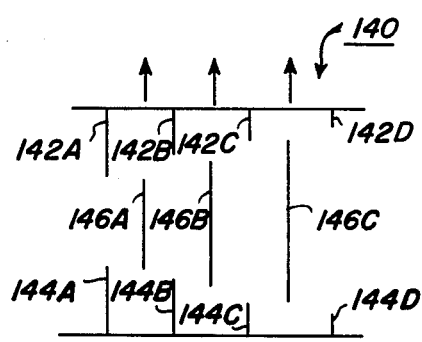

In FIG. 10C, current confinement geometry 140 comprises current confinement stripes 146, each of different length, i.e., stripe 146A is smaller in length than stripe 146B, which is smaller in length than stripe 146C. Stripes 146 are of varying length across the array laser but do not extend to the ends of the laser cavity length. In the same but opposite manner relative to varying length, the offset stripe geometry in the form of segment stripes 142 and 144 are provided at adjacent ends of the laser cavity length. Segment stripes 142 and 144 become progressively shorter in length across the array laser as intermediate stripes 146 become progressively longer in length. Thus, aligned offset stripes 142A and 144A are longer in length compared to aligned stripes 142B and 144B, which in turn are longer in length than aligned offset stripes 142C and 144C, which in turn are longer in length than aligned offset stripes 142D and 144D.

Figure 10D:
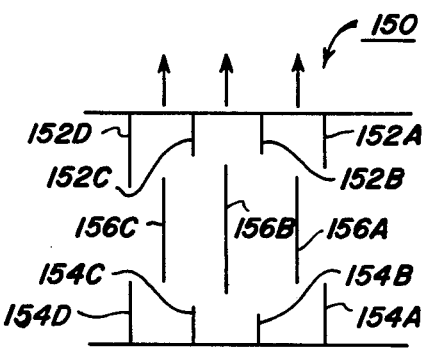

In FIG. 10D, current confinement geometry 150 also comprises stripe geometry of varying lengths relative to both the optical guide region and offset regions as in the case of FIG. 10C. However, in FIG. 10D, the varying in stripe length varies from the center of the laser structure to the outside edges of the laser structure, whereas in FIG. 10C, stripe length varies from one side of the laser structure to the opposite side of the laser structure.

In FIG. 10D, the stripes 156 in the optical guide regions are of different lengths vary in length from the center of the structure to the outside edges wherein stripe 156B is longer in length as compared to stripes 156A and 156C Stripes 156A and 156C may be of the same or similar length or of different length but not larger in length than stripe 156B. By the same token, aligned offset stripes 152 and 154 vary in length from the center of the structure to the outside edges. In this regard, aligned offset stripes 152B and 152C, and 154B and 154C are of the same or similar length but of shorter length compared to the outer aligned offset stripes 152A and 152, and 154A and 154D.

Figure 10E:
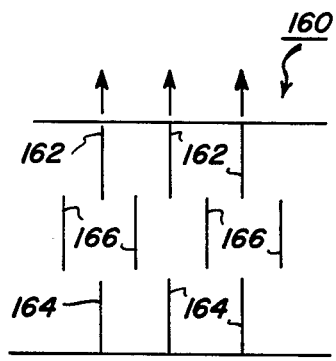

Current confinement geometry 160 shown in FIG. 10E is similar to geometry 120 shown in FIG. 10A, except that the offset geometry extends to the adjacent sides of all optical guide regions. In this connection, the confined optical guide regions are represented by aligned segment stripes 162 and 164 while offset stripes 166 are positioned on adjacent sides of the optical guide regions at those portions where ther is no stripe geometry present in the optical guide regions.

Figure 10F:
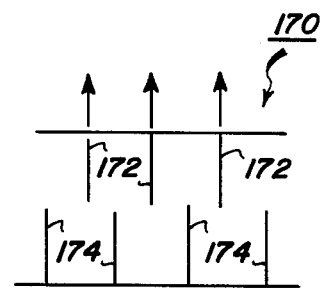

The current confinement geometry 170 of FIG. 10F comprises stripes 172 at areas of the optical guide regions of the laser elements whic extend approximately one half the length of the laser cavity. The offset stripe geometry is represented by stripes 174 which are in regions adjacent to the optical guide region of the lasing elements and extend for the length of the laser cavity where there is no stripe geometry present relative to the optical guide regions.

Figure 10G:
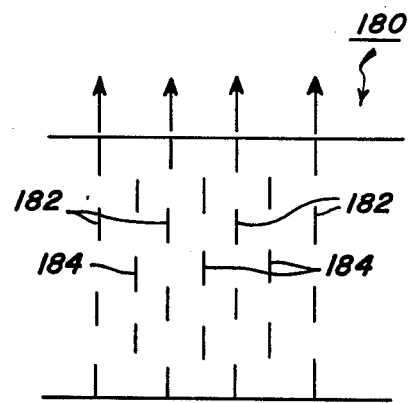

The current confinement geometry 180 shown in FIG. 10G comprises a series of optical guide regions having aligned intermittent segment stripe geometry 182 whereas in the offset regions, the offset stripe geometry 184 comprises aligned intermittent segment stripes wherein each segment is adjacent to regions where there is no segment stripe geometry 182.

In all of cases relative to FIGS. 9 and 10, the major concept is to provide an increase in integral gain along the laser length, vis a vis the lateral extent of the laser as noted in connection with previous index waveguide embodiments, in order to provide offset regions of higher gain relative to optical guide regions representing the optical cavities of a series of phase locked laser elements.

Although all the foregoing embodiments have been described in connection with semiconductors of the GaAs and GaAlAs regime, other light emitting materials may be employed, such as InGaAsP, GaAlP, GaAlSb, PbSnTe SiC or any other III-V or II-VI semiconductor material that will support lasing action or any organic material or compound that will support lasing action. Further, in each embodiment illustrated, the active region may comprise a single active layer or, alternatively, may comprise an active region of either single quantum well or multiquantum well.

While the invention has been described in conjunction with a few specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. A phased array semiconductor laser comprising a plurality of spatially disposed multiple lasing elements formed relative to an active region providing optical cavities for light wave generation and propagation under lasing conditions and wherein the optical field of said lasing elements are coupled into the optical cavities of adjacent lasing elements to provide a phased locked condition across the array, structural means associated with said laser to cause regions between said optical cavities to produce higher gain in said between regions compared to the gain experienced in said optical cavities by spatially modulating the optical overlap of the optical field of each of said lasing elements laterally across the array so as to favor the fundamental supermode over the other potential supermodes of said laser.

2. The phased array semiconductor laser of claim 1 wherein said laser includes a transparent waveguide layer adjacent to said active region and having a periodic undulation laterally across said laser array to provide said spatial modulation to enhance the amount of gain experienced in said between regions compared to the gain experienced in said optical cavities.

3. The phased array semiconductor laser of claim 1 wherein said spatial modulation includes current confinement means to spatially modulating the current distribution laterally across said laser array to provide additional spatial modulation to enhance the amount of gain experienced in said between regions compared to the gain experienced in said optical cavities.

4. The phased array semiconductor laser of any one of claims 1–3 wherein said active region is a single planar active layer.

5. The phased array semiconductor laser of any one of claims 1–3 wherein said active region is a single quantum well.

6. The phased array semiconductor laser of of any one of claims 1–3 wherein said active region is a multiple quantum well.

7. A phased array semiconductor laser comprising a plurality of spatially disposed multiple lasing elements formed relative to an active region providing optical cavities for light wave generation and propagation under lasing conditions and wherein the optical field of said lasing elements are coupled into the optical cavities of adjacent lasing elements to provide a phased locked condition across the array, structural means associated with said laser to cause regions between said optical cavities to produce higher gain in said between regions compared to the gain experienced in said optical cavities by spatially modulating the current distribution laterally across said laser array so as to favor the fundamental supermode over the other potential supermodes of said laser, said structural means comprising an array of current confinement means, portions of which are outside of said optical cavities at said between regions to enhance the amount of gain experienced in said between regions compared to the gain experienced in said optical cavities.

8. The phased array semiconductor laser of claim 7 wherein current confinement means comprises cavity current confinement stripes positoned relative to each of said optical cavities and extending along at least one portion of the length of each of said laser optical cavities, offset current confinement stripes at said between regions and extending along at least one portion of the length of said between regions wherein none of said between region stripe portions are disposed adjacently to any of said cavity stripe portions.

9. The phased array semiconductor laser of any one of claims 7 and 8 wherein said active region is a single planar active laser.

10. The phased array semiconductor laser of any one of claims 7 and 8 wherein said active region is a single quantum well.

11. The phased array semiconductor laser of any one of claims 7 and 8 wherein said active region is a multiple quantum well.

12. A phased array semiconductor laser wherein the light wave of a plurality of spatially disposed multiple lasing elements operating in confined optical cavities are coupled to provide a phased locked condition across the laser array, means to tailor the gain distribution across the laser array so that specific regions of higher gain are located in regions between said optical cavities for each of said elements in order to discriminate among possible supermodes obtainable from said laser, said tailoring means comprising structural means associated with said laser to spatially modulate the optical overlap of said light waves by enhancement of the filling factor, $\Gamma$, in said between regions vis a vis said optical cavities to thereby favor fundamental supermode operation over other of said possible supermodes.

13. The phased array semiconductor laser of claim 12 wherein said laser includes a transparent waveguide layer having a periodic undulation laterally across said laser array to form a higher real refractive index region as part of each of said optical cavities to provide said periodic undulation to enhance the amount of gain experienced in said between regions compared to the gain experienced in said optical cavities.

14. The phased array semiconductor laser of claim 1 wherein said spatial modulation includes current confinement means to spatially modulating the current distribution laterally across said laser array to provide additional spatial modulation to enhance the amount of gain experienced in said between regions compared to the gain experienced in said optical cavities.

15. The phased array semiconductor laser of any one of claims 12–14 wherein said laser has an active region comprising a single planar active layer.

16. The phased array semiconductor laser of any one of claims 12–14 wherein said laser has an active region comprising a single quantum well.

17. The phased array semiconductor laser of any one of claims 12–14 wherein said laser has an active region comprising a multiple quantum well.

18. A phased array semiconductor laser wherein the light wave of a plurality of spatially disposed multiple lasing elements operating in confined optical cavities are coupled to provide a phased locked condition across the laser array, means to tailor the gain distribution across the laser array so that specific regions of higher gain are located in regions between said optical cavities for each of said elements in order to discriminate among possible supermodes obtainable from said laser, said tailoring means comprising structural means associated with said laser to spatially modulate the the current distribution laterally across said laser array to enhance the filling factor, $\Gamma$, in said between regions vis a vis said optical cavities to thereby favor fundamental supermode operation over other of said possible supermodes, said structural means comprising an array of current confinement means, portions of which are outside of said optical cavities at said between regions to enhance the amount of gain experienced in said between regions compared to the gain experienced in said optical cavities.

19. The phased array semiconductor laser of claim 18 wherein current confinement means comprises cavity current confinement stripes positoned relative to each of said optical cavities and extending along at least one portion of the length of each of said laser optical cavities, offset current confinement stripes at said between regions and extending along at least one portion of the length of said between regions wherein none of said between region stripe portions are disposed adjacently to any of said cavity stripe portions.

20. The phased array semiconductor laser of any one of the claims 18 and 19 wherein said laser has an active region comprising a single planar active layer.

21. The phased array semiconductor laser of any one of the claims 18 and 19 wherein said laser has an active region comprising a single quantum well.

22. The phased array semiconductor laser of any one of the claims 18 and 19 wherein said laser has an active region comprising a multiple quantum well.

23. A phased array semiconductor laser wherein the light wave of spatially disposed multiple lasing elements operating in confined optical cavities are coupled to provide a phased locked condition across the array, means to tailor the gain distribution across the array so that regions of higher gain are located between said optical cavities for each of said elements in order to discriminate among possible supermodes obtainable from said laser, said tailoring means comprising a transparent waveguide means having a periodic undulation to spatially modulate the optical overlap of said light weaves by enhancement of the filling factor, $\Gamma$, in said between regions vis a vis said optical cavities to thereby favor fundamental supermode operation over other of said possible supermodes.

24. A phased array semiconductor laser wherein the light wave of spatially disposed multiple lasing elements operating in confined optical cavities are coupled to provide a phased locked condition across the array, means to tailor the gain distribution across the array so that regions of higher gain are located between said optical cavities for each of said elements in order to discriminate among possible supermodes obtainable from said laser, said tailoring means comprising an array of current confinement means, portions of which are outside of said optical cavities at said between regions to provide spatial modualtion of the current distribution across said array to enhance the amount of gain experienced in said between regions compared to the gain experienced in said optical cavities.

25. A phased array semiconductor laser comprising a plurality of spatially disposed multiple lasing elements formed relative to an active region providing optical cavities for light wave generation and propagation under lasing conditions and wherein the optical field of said lasing elements are coupled into the optical cavities of adjacent lasing elements to provide a phased locked condition across the array, structural means associated with said laser to cause regions between said optical cavities to produce higher gain in said between regions compared to the gain experienced in said optical cavities by spatially modulating the current distribution laterally across said laser array so as to favor the fundamental supermode over the other potential supermodes of said laser, said structural means comprising a plurality of spatially disposed high conductivity regions formed lateral across and within said laser array in said between regions.

26. The phased array semiconductor laser of claim 25 wherein said array laser include an active region and adjacntly disposed cladding layers, said high conductivity regions comprised regions of high doping concentration embedded in at least one of said cladding layers.

* * * * *